United States Patent [19]

Hasegawa et al.

[11] Patent Number: 4,536,724
[45] Date of Patent: Aug. 20, 1985

[54] VOLTAGE-CONTROLLED OSCILLATOR HAVING THREE OR MORE VARACTOR DIODES

[75] Inventors: Makoto Hasegawa, Kawasaki; Mitsuo Makimoto, Yokohama; Sadahiko Yamashita, Sagamihara; Yoshio Katayama, Yokohama, all of Japan

[73] Assignee: Matsushita Electric Industrial Company Limited, Kadoma, Japan

[21] Appl. No.: 451,838

[22] Filed: Dec. 21, 1982

[30] Foreign Application Priority Data

Dec. 21, 1981 [JP] Japan ................. 56-207662

[51] Int. Cl.³ .............................................. H03B 5/08
[52] U.S. Cl. ................. 331/177 V; 331/36 C; 331/117 R
[58] Field of Search ............. 331/36 C, 116 R, 117 R, 331/177 V; 332/30 V; 357/80; 361/400, 409, 412, 414

[56] References Cited

U.S. PATENT DOCUMENTS

| | | | |
|---|---|---|---|
| 3,670,205 | 6/1972 | Dixon et al. | 361/401 X |
| 4,297,654 | 10/1981 | Goerth | 331/116 R X |
| 4,353,038 | 10/1982 | Rose et al. | 331/177 V X |
| 4,378,532 | 3/1983 | Burgoon | 331/116 R X |

FOREIGN PATENT DOCUMENTS

| | | | |
|---|---|---|---|
| 2929897 | 1/1981 | Fed. Rep. of Germany | 331/177 V |
| 409050 | 9/1966 | Switzerland | 361/400 |

Primary Examiner—Eugene R. LaRoche
Assistant Examiner—Robert J. Pascal
Attorney, Agent, or Firm—Cushman, Darby & Cushman

[57] ABSTRACT

In a voltage-controlled oscillator having an LC resonant circuit including a varactor circuit so that resonant frequency is controlled by a D.C. bias or control voltage applied to the varactor circuit, three or more varactors are connected in series in one embodiment so that a high-frequency voltage applied to the varactor circuit is divided into a plurality. The varactors may be connected in the same direction or opposite direction. In another embodiment, a plurality of series circuits of varactors are connected in parallel to provide the varactor circuit, where each series circuit comprises two or more varactors. A series-parallel connection of a plurality of varactors may be arranged in a matrix. In order to reduce undesirable stray capacitance, some or all varactors are attached to a printed circuit board so that they are normal to the plane of the printed circuit board. In one embodiment an auxiliary printed circuit board is employed so that some varactors are spaced from a main circuit board. The voltage-controlled oscillator of the invention shows high carrier-to-noise ratio throughout a wide frequency range.

11 Claims, 15 Drawing Figures

FIG. 11A
FIG. 11B
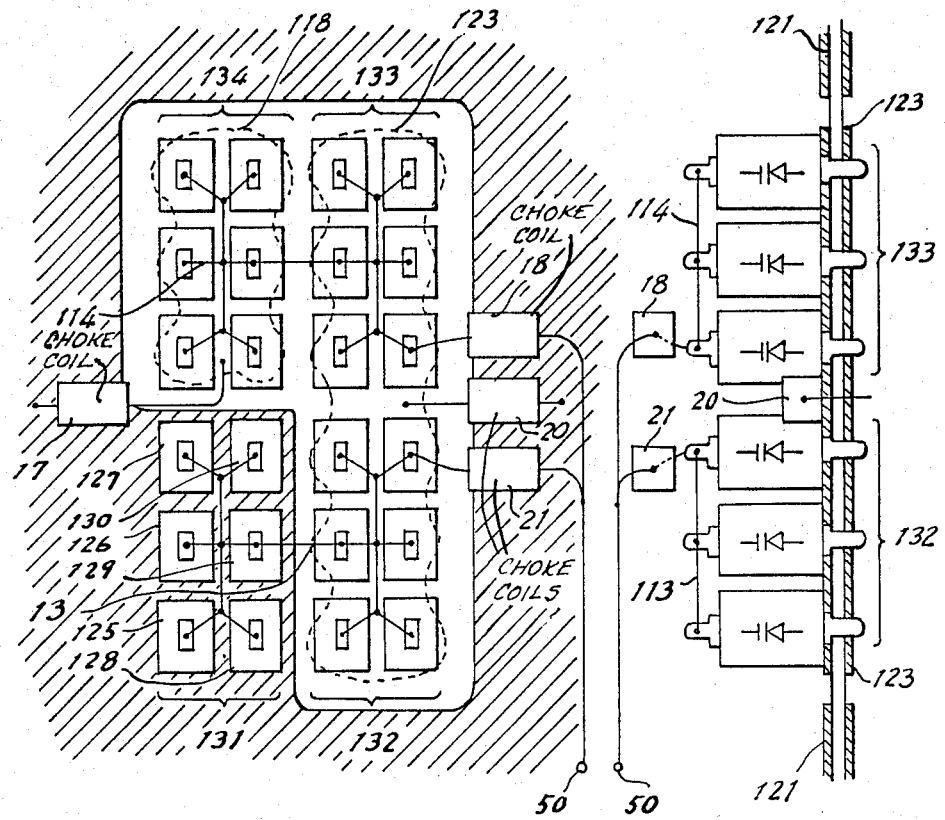
FIG. 11C
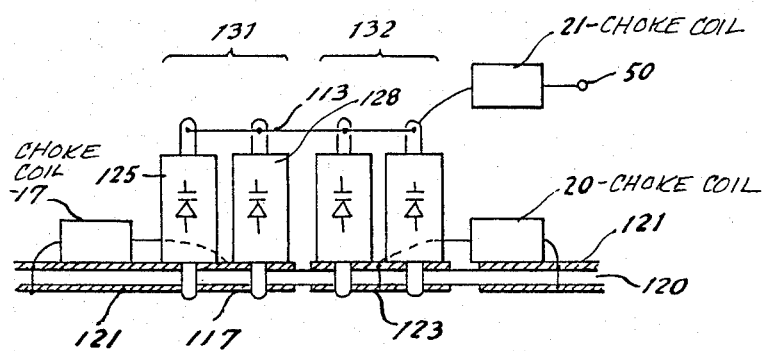

VOLTAGE-CONTROLLED OSCILLATOR HAVING THREE OR MORE VARACTOR DIODES

BACKGROUND OF THE INVENTION

This invention relates generally to a voltage-controlled oscillator (VCO) for use with a radio transmitter or receiver of frequency synthesizing type, and more particularly, the present invention relates to VCOs using a plurality of voltage-variable capacitance or varactor diodes.

Some conventional VCOs employ one or two varactor diodes so that oscillating frequency can be changed in accordance with a D.C. bias or control voltage applied to the varactor diodes. However, such conventional VCOs have suffered from a drawback if the carrier-to-noise (C/N) ratio deteriorates when the VCO is used for a wide frequency band, such as over 5 percent in terms of band ratio, or when a low D.C. voltage is applied to the varactor diode. In detail, when it is intended to cover a wide frequency range by a single tuning circuit, the capacitance of the varactor is selected to be a relatively small value compared with a coupling capacitor which is connected in series with the varactor. Accordingly, the voltage of the high-frequency signal applied to the varactor is relatively large, resulting in deterioration in C/N. Furthermore, when it is intended to cover a wide frequency band, the D.C. bias voltage applied to the varactor may be selected to be a relatively low voltage so that capacitance thereof changes widely in response to a small change in the D.C. bias voltage. However, nonlinear distortion of a varactor per se is large at such an operating point of a low D.C. bias voltage. Therefore, distortion in capacitance variation due to application of a high-frequency voltage is remarkable. In addition to the above reason, the value of Q of a varactor is apt to lower when such a low D.C. bias voltage is given. For these reasons, when a varactor operates at a nonlinear region in accordance with an applied high-frequency voltage, the C/N is apt to deteriorate.

In conventional wideband radio equipment which is required to show a carrier-to-noise ratio of over 90 dB as in a radio receiver, therefore, two or more VCOs are employed in such a manner that each VCO covers a given frequency range so that a desired wideband is covered by the plurality of frequency ranges of the VCOs.

SUMMARY OF THE INVENTION

The present invention has been developed in order to remove the above-described drawbacks inherent to the conventional voltage-controlled oscillator having one or two varactor diodes.

It is, therefore, an object of the present invention to provide a new and useful voltage-controlled oscillator which shows a high carrier-to-noise ratio throughout a wide frequency range.

According to a feature of the present invention three or more varactors are connected in series to constitute a series connection so that the series connection is used in place of the single or two varactors in the conventional arrangement.

According to another feature of the present invention, the varactor circuit comprises a parallel circuit of varactors, wherein one branch constituting the parallel circuit comprises a series connection of two or more varactors.

According to a further feature of the present invention some or all varactors are mounted on a printed circuit board so that they are normal to the plane of the printed circuit board, thereby reducing undesirable stray capacitance and insuring wide frequency range.

BRIEF DESCRIPTION OF THE DRAWINGS

The object and features of the present invention will become more readily apparent from the following detailed description of the preferred embodiments taken in conjunction with the accompanying drawings in which:

FIGS. 11A, 11B and 11C show another embodiment of the present invention, in which the varactor matrix of FIG. 10 are constructed on a printed circuit board.

The same or corresponding elements and parts are designated at like reference numerals throughout the drawings.

DETAILED DESCRIPTION OF THE INVENTION

Prior to describing the preferred embodiments of the present invention, the above-mentioned conventional arrangements will be described with reference to FIGS. 1A, 1B and 2 for a better understanding of the present invention.

Figure 1A:
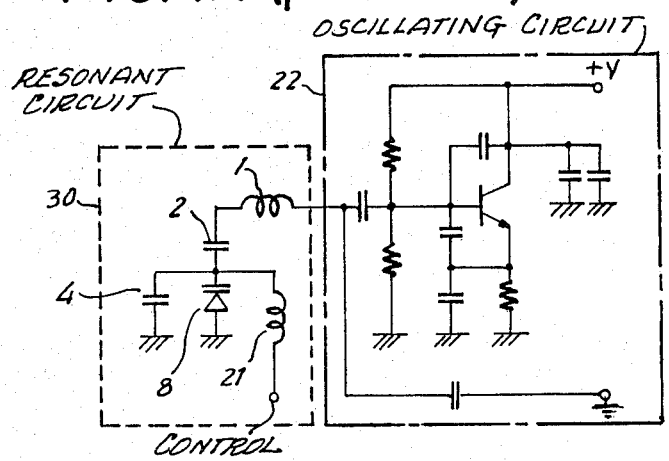
FIG. 1A is a circuit diagram showing a conventional voltage-controlled oscillator.

FIG. 1A shows a conventional voltage-controlled oscillator (VCO) having a varactor diode 8. The conventional VCO of FIG. 1A comprises basically an oscillating circuit or amplifer 22 and a resonant or tuning circuit 30. The resonant circuit 30 comprises a resonant coil 1, a coupling capacitor 2, a fixed capacitor 4, a varactor diode 8, and a choke coil 21. The varactor diode 8 is arranged to receive a D.C. bias or tuning control voltage through the choke coil 21 functioning as a D.C. bias supplying circuit so that the capacitance of the varactor diode 8 changes in accordance with the D.C. voltage applied thereto. The fixed capacitance 4 is connected in parallel with the varactor diode 8 to adjust the sensitivity (Hz/V) of the VCO. This fixed capacitance 4 may be omitted if unnecessary. In the above the word "sensitivity" is used to mean the amount of frequency change per unit D.C. voltage applied to the varactor diode 8. Namely, higher the sensitivity, the wider the frequency range coverable by the VCO.

Figure 1B:
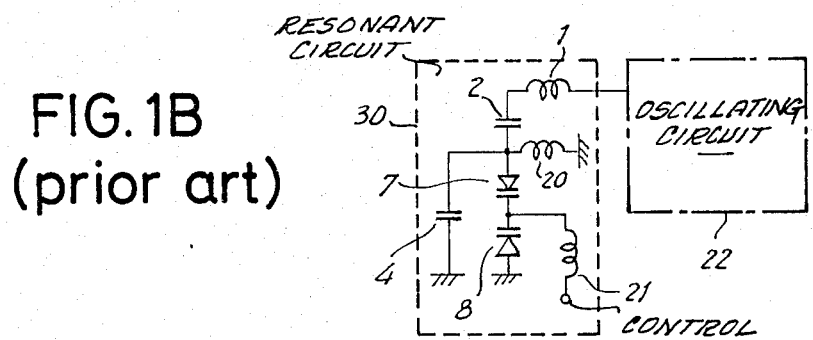
FIG. 1B is a circuit diagram showing another conventional voltage-controlled oscillator.

FIG. 1B shows another conventional voltage-controlled oscillator (VCO) having two varactor diodes 7 and 8 connected inversely in series. A junction connecting the cathodes of the two varactor diodes 7 and 8 to each other is connected to a first choke coil 21, while another junction between the coupling capacitor 2 and the varactor diode 7 is connected via a second choke coil 20 to ground. Furthermore, the latter junction is connected via a fixed capacitor 4 to ground. The first and second choke coils 21 and 20 are employed to supply a D.C. bias voltage to the varactor diodes 7 and 8.

Figure 2:
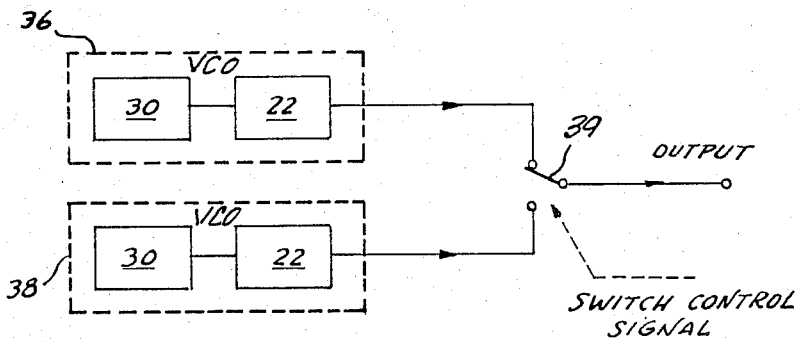
FIG. 2 is a block diagram of a conventional tuning circuit used in a radio receiver.

FIG. 2 shows a conventional tuning circuit used in a radio receiver for VHF band. Since the conventional VCO arrangement of FIGS. 1A and 1B cannot cover a wide frequency range, such as 20 MHz between 142 and 162 MHz, with high C/N, such as over 90 dB, two or more VCOs are employed so that a desired wide band is covered by these two or more VCOs. In the illustrated arrangement, two VCOs 36 and 38 are provided so that one of them is selectively used by switching the output signals from the VCOs 36 and 38. Namely, a switching circuit 39 is controlled by a control signal so that one of the two VCOs 36 and 38 is used to tune the receiver at a desired frequency.

Figure 3:
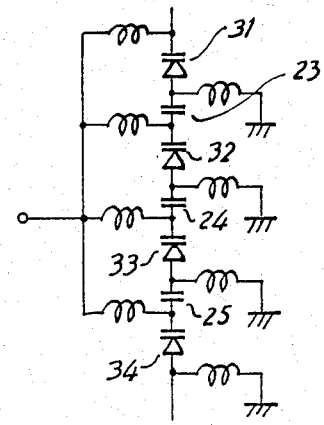
FIG. 3 is a circuit diagram of a series connection of a plurality of varactor diodes, which may be used in place of one or two diodes in the conventional arrangements of FIGS. 1 and 2.
Figure 4:
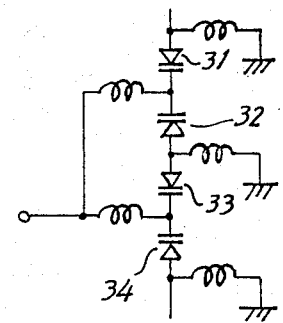
FIG. 4 is a circuit diagram of a series inverse connection of a plurality of varactor diodes, which may be used in place of one or two diodes in the conventional arrangements of FIGS. 1 and 2.

As described in the above, according to the present invention three or more voltage-variable capacitors or varactors are connected in series in such a manner that each varactor receives a D.C. bias voltage. FIGS. 3 and 4 respectively show such series connections of varactors. In the arrangement of FIG. 3, a plurality of varactors 31, 32, 33, and 34 are connected in series with capacitors 23, 24 and 25 being interposed between two adjacent varactors. These capacitors 23, 24 and 25 are used to block D.C. current which is applied via respective choke coils (no numeral). The varactor diodes 31, 32, 33 and 34 are connected in series so that a cathode of one diode is connected via a capacitor 23, 24 or 25 to the anode of a next diode.

In the arrangement of FIG. 4, a plurality of varactors 31, 32 and 33 are connected in series so that adjacent varactors are inversely connected to each other. In the arrangment of FIG. 4, capacitors between adjacent varactors are omitted so that a cathode of a varactor is directly connected to an anode of a next varactor. Remaining arrangements in FIG. 4 are the same as those of FIG. 3. Although either of the arrangements of FIGS. 3 or 4 may be used, the series connection arrangement of FIG. 4 is preferable because capacitors for blocking D.C. currrent are not required owing to the inverse connection. Moreover, the arrangement of FIG. 4 is superior to that of FIG. 3 in that the number of choke coils for supplying the D.C. bias voltage is smaller than that in the arrangement of FIG. 3.

Figure 5:
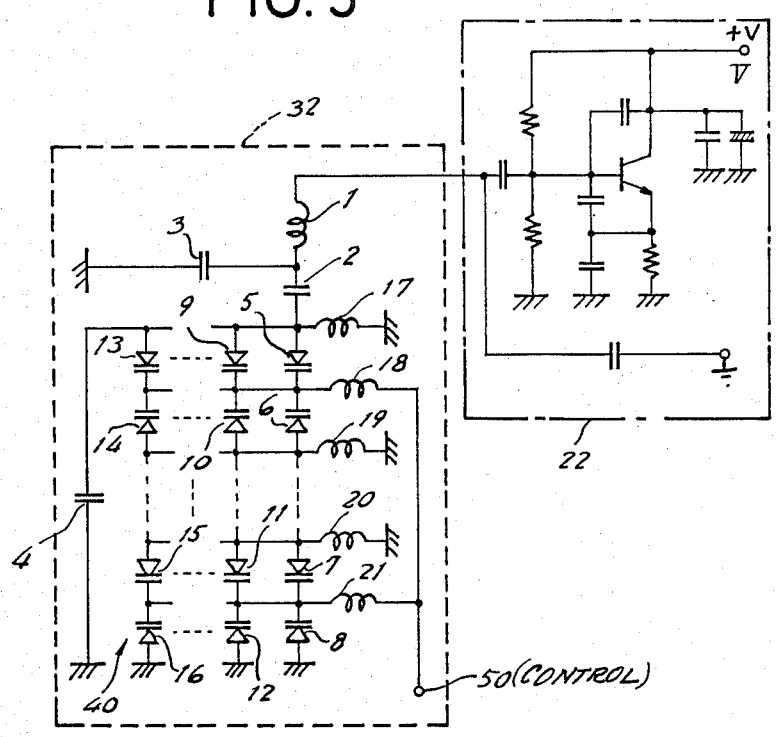
FIG. 5 is a circuit diagram of an embodiment of the voltage-controlled oscillator according to the present invention.

Referring now to FIG. 5, a circuit diagram of an embodiment of the voltage-controlled oscillator (VCO) according to the present invention is shown. The VCO comprises generally an oscillating circuit 22 and an LC resonant circuit 32. The oscillating circuit 22 per se is of a conventional one, and the illustrated circuit is a Clapp oscillator. However, the oscillating circuit 22 is not limited to a grounded-collector circuit, and therefore other type oscillating circuits may be employed if desired.

The LC resonant circuit comprises a varactor circuit 40 having a parallel circuit of a plurality of series circuits of varactors 5-16. In detail, each series circuit or branch includes a plurality of varactors which are connected in series inversely. Namely, each series circuit is substantially the same as that shown in FIG. 4. The parallel circuit 40, which may be referred to as a series-parallel circuit or a varactor matrix hereafter, is connected to ground at one end thereof, and is further connected, at the other end, via a series circuit of a coupling capacitor 2 and a resonant coil 1 to the oscillating circuit 22. A junction between the resonant coil 1 and the coupling capacitor 2 is connected via a capacitor 3 to ground. This capacitor 3 is used to adjust the absolute value of the resonance frequency, and therefore it may be omitted if unnecessary. Another capacitor 4 is connected in parallel with the varactor matrix 40 for the adjustment of the sensitivity of the VCO. A plurality of choke coils 17–21 are provided to supply each of the varactors 5–16 with a D.C. bias voltage. The choke coils 17–21, functioning as a D.C. bias supplying means, are divided into two groups or sets. Each choke coil of the first set 17, 19 and 20 is connected to ground at one end, and is further connected, at the other end, to the anode of each varactor 5–16. Each choke coil of the second set 18 and 22 is connected to a terminal 50 at one end, and is further connected, at the other end, to the cathode of each varactor 5–16. The terminal 50 is arranged to receive a D.C. bias voltage from a (not shown) power source. Summarizing the structure of the varactor circuit 40, it comprises a series-parallel connection or a matrix of a plurality of varactors 5–16. The series circuits xay be referred to as rows, and the number of parallel circuits may be referred to as columns in a matrix. Namely, the number of varactors in such a matrix arrangement will be expressed in terms of rows and columns.

The number of varactors included in each series circuit is preferably as many as possible because a larger number of series connected varactors results in lower high-frequency voltage applied to each varactor due to voltage division. Although the illustrated embodiment comprises the parallel circuit 40 of a plurality of series circuits, such a parallel circuit 40 or matrix arrangement is not necessarily used. In other words, a single series circuit of three or more varactors may be used. However, when the number of series circuits connected in parallel increases, the frequency range covered by the LC resonator is widened because the total capacitance of the varactor circuit 40 increases.

Since such parallel arrangement provides a wide band, when the frequency band is wider than a desired band, the capacitance of the coupling capacitor 2 may be reduced to narrow an excessively wide band provided by the parallel arrangement. Therefore, coupling between the varactor circuit 40 and the oscillating circuit 22 is rendered loose so that the high-frequency voltage applied to each of the varactors 5–16 can be reduced. For these reasons, it is preferable that a number of series circuits of varactors are connected in parallel.

From the above it will be understood that the high-frequency voltage applied to each varactor 5–16 in the series-parallel or matrix arrangement may be controlled or designed in accordance with the nonlinear distortion of each varactor per se defined by a voltage-capacitance characteristic because the characteristic of the high-frequency voltage applied to each varactor in response to a given range of the D.C. bias voltage can be changed by selecting the number of varactors connected in series and parallel. Therefore, the value of C/N which is mainly determined by the high-frequency voltage applied to each varactor and the nonlinear distortion, is improved throughout a wide frequency range, while high sensitivity is insured because a sufficiently large high-frequency voltage is applied to the LC series circuit.

Generally speaking, in order to actualize a high value of C/N, it is necessary that the current consumed by an oscillating element, i.e. the transistor in the oscillating circuit 22 in the illustrated embodiment, is maintained above a given value. To this end, it is required that the high-frequency voltage applied to the LC series circuit is high enough. However, it is necessary that the high-frequency voltage applied to a single varactor is low as described in the above. The arrangement of FIG. 5 in which a plurality of varactors are connected in series and parallel solves this contradictory problem.

Figure 6:
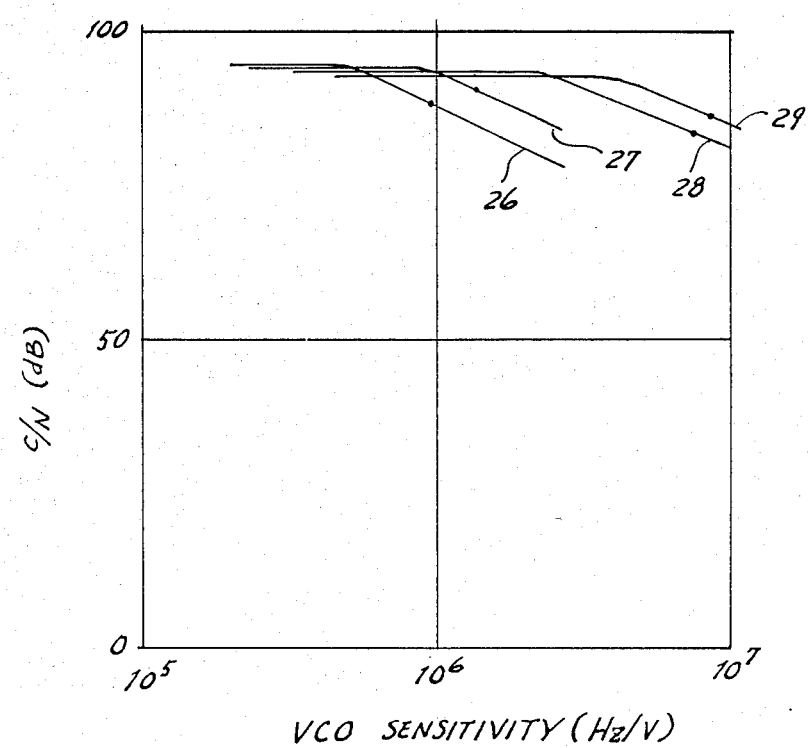
FIG. 6 is a graphical representation showing the difference in carrier-to-noise ratio between the conventional arrangement and various embodiments of the present invention.

FIG. 6 is a graphical representation showing the relationship between C/N and sensitivity throughout various varactor circuit arrangements used in a VCO. The illustrated results are obtained under the condition that an oscillating frequency is multiplied by two so that output oscillating frequency is 135 MHz or so; the power source voltage applied to the VCO is 9 volts; and the D.C. bias voltage applied to each varactor is 8 volts. The D.C. bias voltage applied to each varactor is variable between 2 and 20 volts so as to change the oscillating frequency.

In FIG. 6, four typical characteristic curves 26, 27, 28 and 29 are shown, where the curve 26 shows a characteristic when a single varactor is used as shown in FIG. 1A; the curve 27 shows the same when a varactor matrix of two rows and two columns (total number of varactors being four) is used; the curve 28 shows the same when a varactor matrix of three rows and three columns (total number of varactors being nine); and the curve 29 shows the same when a varactor matrix of four rows and four columns (total number of varactors being sixteen). The number of rows and columns in each matrix arrangement are made equal to each other for comparison between various matrices so that the total capacitance with respect to an applied voltage and the value of Q as the entire varactor matrix does not theoretically change, while it is possible to effect comparison under substantially the same conditions. Namely, the number of series connected varactors and parallel connected varactors are made equal to each other for the purpose of comparison, and therefore, it is unnecessary to set the numbers of rows and columns to a common number in practice.

As will be understood from FIG. 6, to increase the sensitivity of a VCO, the high-frequency voltage applied to the LC resonant circuit is raised. However, this increase results in deterioration in C/N. From the comparison between the illustrated four curves 26 to 29, it will be understood that, the larger the number of varactors in a matrix arrangement, the higher is the value of C/N at a higher sensitivity. In other words, when a number of varactors are connected in series and parallel to form a matrix as shown in FIG. 5, C/N at high sensitivity operation is bettered.

Since sensitivity can be increased by increasing the high-frequency voltage applied to LC series circuit, and since C/N is maintained high by dividing the high-frequency voltage so that each varactor receives a relatively small high-frequency voltage, sensitivity of the VCO can be increased without deteriorating the value of C/N by increasing the number of rows and colums in the matrix. Thus, a wide frequency range can be actualized without suffering from deterioration in C/N .

Figure 7A:
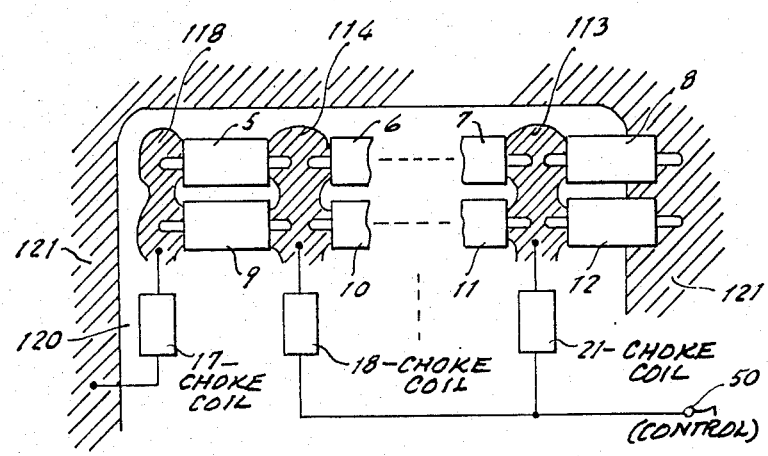
FIGS. 7A, and 7B show various parts of the VCO accoding to the present invention, which parts are mounted on a printed circuit board by way of a conventional fabrication technique.
Figure 7B:
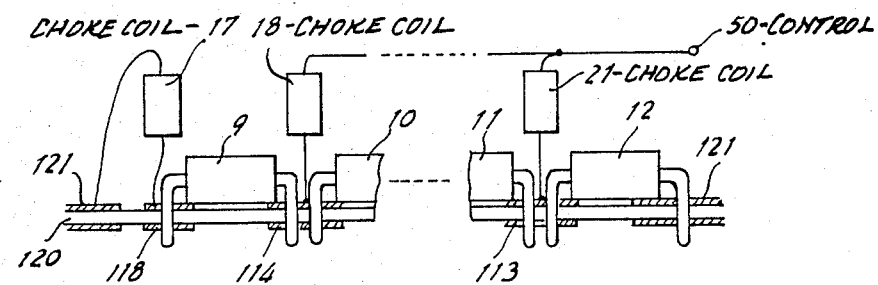

Now a further detailed circuit construction will be described in connection with the way of assembling various parts of the VCO according to the present invention. Usually, the LC resonant circuit is constructed on a printed circuit board. When a conventional assembling technique is simply adapted to manufacture a series or series-parallel circuit of varactors on a printed circuit board, the arrangement would be as shown in FIGS. 7A and 7B which are a top plan view and a front view of a part of the VCO. Namely, each varactor 5-12 having anode and cathode at both ends is attached to the printed circuit board 120 with their electrodes being soldered to terminals or conductors 113, 114, 118 provided on the printed circuit board 120.

When the circuit arrangement of FIGS. 7A and 7B is used, even if the bias supplying circuits 17, 18 and 19 are of sufficiently high impedance, there exist stray capacitances between the cathode junction 113, 114 and ground terminal or conductor pattern 121 or between anode junction 118 and the ground terminal 121. When the insulating material of the printed circuit board is made of glass epoxy for instance, the stray capacitance is 1 to 4 pF. Such an undesirable stray capacitance causes the total capacitance of the varactor circuit to be unnecessarily large, and therefore, such an increase in capacitance results in decrease in the variable range of the capacitance. This phenomenon is remarkable as the number of varactors connected in series becomes large because the resultant capacitance of such a series circuit becomes small as the number of varactors increases. Furthermore, when the number of rows connected in parallel increases, the conductor pattern on the printed circuit board widens, and therefore, the value of stray capacitance increases.

Moreover, such stray capacitances also cause the high-frequency voltage applied to each varactor to be different from another for the following reasons. Assuming that the total capacitance in a single column in a matrix, such as shown in FIG. 5, is expressed in terms of Cv, and an equal amount of stray capacitance expressed in terms of Cs exists in each of the columns, the resultant capacitance Cn of such a matrix having "n" columns will be given as follows assuming that the bias supplying circuit shows a high impedance:

$$C_n = C_v + C_s$$
$$(\text{wherein } n = 1)$$

$$C_n = \frac{1}{\frac{1}{C_{n-1}} + \frac{1}{C_v}} + C_s$$

$$(\text{wherein } n = 2, 3, 4 \ldots)$$

From the above formulas it will be recognized that an equivalent capacitance of each column does not equal $C_n/n$ when n is more than one although the equivalent capacitance of each column is $C_n/n$ when Cs=0. Such uneven distribution of capacitances results in unbalance in application of the high-frequency voltage to respective varactors in the matrix. Namely, varactors of one or more columns receive higher high-frequency voltages than other varactors so that undesirable influence due to nonlinearity of the varactor appears in connection with these particular varactors. As a result, in a radio receiver various undesirable phenomena, such as detuning, cross modulation, deterioration in C/N or the like occur. In order to avoid such undesirable phenomena it is necessary to reduce such stray capacitance so that each high-frequency voltage applied to each varactor is substantially equal to each other.

Figure 8:
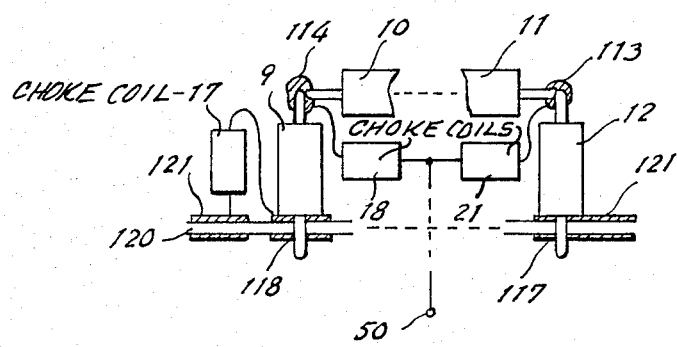
FIG. 8 is a front view of an embodiment of the present invention, showing a part of the VCO constructed on a printed ciruit board.

Various embodiments for reducing such undesirable stray capacitance will be described with reference to FIGS. 8 to FIG. 11C. In the embodiment of FIG. 8, one varactor 12 which is positioned at one end of the series circuit as shown in FIG. 5 is vertically arranged with respect to a printed circuit board 120. In other words, the first end varactor 12 having an anode and a cathode respectively is attached to the printed circuit board 120 so that the anode thereof is connected and fixed to a conductor 117 on the printed circuit board 120. Another varactor 9, which may be referred to as a second end varactor because it is positioned at the other end in the series circuit as shown in FIG. 5, is also situated so that it is normal to the plane of the printed circuit board 120 in the same manner as the first end varactor 12. Remaining varactors 10, 11 are interposed between the cathodes of the first and second end varactors 12 and 9. In detail, the cathode of the varactor 10 is directly connected to the cathode of the second end varactor 9, while the cathode of the varactor 11 is also directly connected to the cathode of the first end varactor 12. The references 114 and 113 indicate cathode junctions, and these junctions 114 and 113 are shown as the cathodes of two consecutive varactors are secured to each other by means of solder. Anodes of these varactors 10, 11 are also connected to each other directly similarly in the case that the number of varactors in a single row is four. As shown in FIG. 8, the varactors 10, 11 interposed between the first and second end varactors 12 and 9 are held substantially parallel to the printed circuit board 120 so that the body of the varactors 12 and 9 are spaced from the printed circuit board 120. The choke coils 18 and 21 functioning as D.C. bias supplying means are shown to be connected respectively to the junctions 114 and 113 so that the choke coils 18 and 21 are also spaced from the printed circuit board 120. Although FIG. 8 shows only a single row of the varactor matrix of FIG. 5, remaining rows may be similary mounted on the printed circuit board 120.

Figure 9:
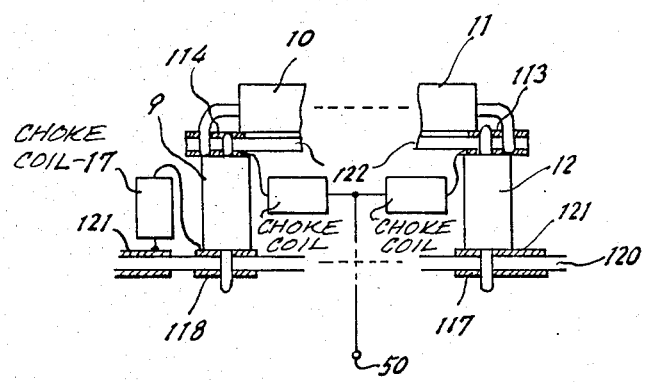
FIG. 9 is a front view of another embodiment or modification of the arrangement of FIG. 8.

Another embodiment of FIG. 9 is similar to the above-described embodiment of FIG. 8 but differs therefrom in that an auxiliary or second printed circuit board 122 is additionally provided. Namely, the second printed circuit board 122 is held on the cathode sides of the first and second end varactors 12 and 9 so that the second printed circuit board 122 is substantially parallel to the first printed circuit board 120, having a predetermined distance therebetween. The remaining varactors 10, 11 are supported on the second printed circuit board 122. The connection between the cathodes of the second end varactor 9 and its adjacent varactor 10 is effected through a conductor 114 provided to the second printed circuit board 122. Similary, the connection between the cathodes of the first end varactor 12 and its adjacent varactor 11 is effected through another conductor 113 provided to the second printed circuit board 122. The conductors 113 and 114 are printed patterns so that their stray capacitance is negligibly small. It is to be noted that no ground conductor pattern is provided to the second printed circuit board 122 so as to effectively reduce undesirable stray capacitance.

Figure 10:
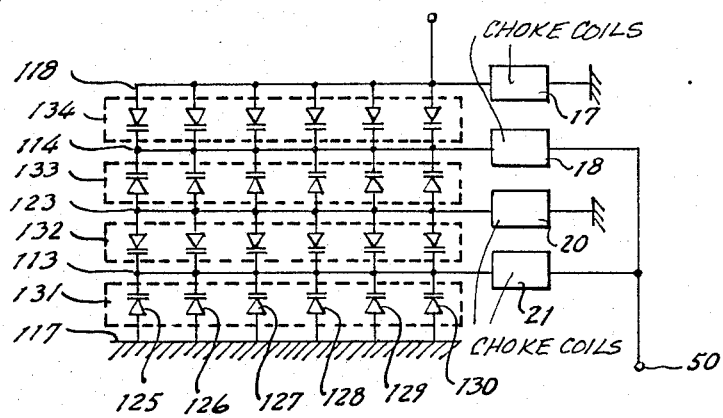
FIG. 10 is a circuit diagram of a varactor matrix according to the present invention.

Another embodiment of the present invention will be described with reference to FIGS. 10 and 11A to 11C. When the number of varactors in each row in the matrix is even, namely, when the number of columns is even, all the varactors constituting the matrix may be vertically attached to the printed circuit board. As an example, let us suppose we are going to fabricate a matrix arrangement of four columns, six rows as shown in FIG. 10. The references 131 to 134 indicate first to fourth columns, while the references 125 to 130 respectively indicate six varactors included in the first column 131. The matrix arrangement of FIG. 10 may be actualized as shown in FIGS. 11A to 11C. FIG. 11A is a top plan view of the matrix constructed on a printed circuit board 120; FIG. 11B, a side view of the same; and FIG. 11C, a front view of the same. The reference 121 is a ground conductor pattern provided to the printed circuit board 120, and the six varactors 125 to 130 of the first column 131 are vertically attached on the ground conductor 121. Remaining varactors, namely, those of second through fourth columns 132 to 134 are also vertically attached on the printed circuit board 120 where no ground conductor is provided.

As best seen in side and front views of FIGS. 11B and 11C, all the varactors of respective columns are normal to the plane of the printed circuit board 120 with their anodes against the printed circuit board 120. Six varactors in each column are combined as shown in FIG. 11A in a group so that four groups of varactors are placed at different sections on the printed circuit board 120. The anodes of the six varactors in each group or column are electrically connected to each other by wire-like conductors 113, 114. The anodes of the varactors 125 to 130 of the first column or group 131 are further electrically connected via the extension of the conductor 113 to the anodes of the second column or group varactors 132. The cathodes of the second column varactors 131 are electrically connected via a conductor pattern or terminal 123 provided on the printed circuit board 120, to the cathodes of the third column varactors 133 as shown in FIG. 11B. The anodes of the third column varactors 133 are electrically connected to the anodes of the fourth column varactors 134 by means of the extension of the conductor 114. The cathodes of the fourth column varactors 34 are connected to a conductor pattern 118 attached to the printed circuit board 120 as shown by a dotted line in FIG. 11A. To this conductor 118 is coupled the choke coil 17 whose other terminal is connected to the ground terminal 117 on the printed circuit board 120. Another choke coil 21 is interposed between the terminal 123 and ground as shown in FIGS. 11A and 11C. Two other choke coils 18 and 21 are respectively connected to the cathodes of the second column varactors 132 and to the cathodes of the third column varactors 133. As shown in FIGS. 11B and 11C, these choke coils 18 and 21 connected to the cathodes of the second and third column varactors 132 and 133 are positioned above the printed circuit board 120 so that they are spaced therefrom. In detail, these choke coils 18 and 21 are held parallel to the plane of the printed circuit board 120.

The embodiment of FIGS. 11A to 11C provides various advantages as follows. First of all, stray capacitances are remarkably reduced as described in the above inasmuch as the cathodes of all the varactors are spaced by the longitudinal or axial length of each varactor from the printed circuit board 120 with the vertical installation. In addition to this reason, since conductor patterns 118 and 123 which are connected to the anodes of the second to fourth column varactors 132, 133 and 134, can be sufficiently spaced from the ground conductor pattern 117, stray capacitances between such conductor patterns are also maintained small. Furthermore, since all the varactors are oriented in a common direction such that anodes are attached to the printed circuit board 120, it is difficult to erroneously attach varactors in opposite direction to the printed circuit board 120 when assembling. Therefore, fabrication is easy. Moreover, since the D.C. supplying circuits or choke coils 18 and 21 connected to the cathodes of the varactors are spaced from the printed circuit board 120 whereas other choke coils 17 and 20 connected to anodes of the varactors are directly placed on the printed circuit board 120, distinction between these two kinds of connections of the choke coils 17, 18, 20 and 21 is easy, and therefore, fabrication is readily effected without confusion. Another aspect of this emobodiment is that the space required or occupied by the number of varactors is very small because all the varactors are vertically arranged in groups.

The above-described embodiments are just examples of the present invention, and therefore, it will be apparent for those skilled in the art that many modifications and variations may be made without departing from the spirit of the present invention.

What is claimed is:

1. A voltage-controlled oscillator having a non-switching continuous frequency band, comprising:
   (a) an oscillating circuit;
   (b) a series circuit of a coupling capacitor and a resonant circuit coil, connected to said oscillating circuit;
   (c) a series circuit of three or more varactors, which series circuit is connected via said series circuit of said coupling capacitor and said resonant circuit coil to said oscillating circuit so far as to form a series resonant circuit; and
   (d) means for supplying a D.C. bias voltage to each of said varactors.

2. A voltage-controlled oscillator as claimed in claim 1, wherein said three or more varactors are connected in such a manner that an anode of one varactor is connected via a capacitor to a cathode of a next varactor.

3. A voltage-controlled oscillator as claimed in claim 1, wherein said three or more varactors are connected in such a manner that a cathode of one varactor is connected to a cathode of a next varactor.

4. A voltage-controlled oscillator, as claimed in claim 3, further comprising a printed circuit board on which various parts constituting said voltage-controlled oscillator are provided, each of said varactors having an anode terminal and a cathode terminal respectively at both ends thereof, said printed circuit board having a ground terminal to which the anode of a first end varactor, which is positioned at one end of said series circuit, is connected, said first end varactor being attached to said printed circuit board so that said first end varactor is substantially normal to the plane of said printed circuit board and the cathode thereof is spaced from said ground terminal, a second end varactor, which is positioned at the other end of said series circuit, being attached to said printed circuit board so that said second end varactor is substantially normal to the plane of said printed circuit board and the cathode thereof is spaced from said printed circuit board, remaining varactors being interposed between the cathodes of said first and second end varactors in such a manner that they are substantially parallel to said printed circuit board, having a space from said printed circuit board, the D.C. bias supplying means having a plurality of first circuits each connected to a junction between cathodes of any two consecutive varactors in such a manner that each of said first circuits is spaced from said printed circuit board, and a plurality of second circuits each connected to anode of each of said varactors other than those connected to said ground terminal.

5. A voltage-controlled oscillator, as claimed in claim 4, further comprising a second printed circuit board connected to the cathodes of said first and second end varactors, said second printed circuit board being substantially parallel to said first mentioned printed circuit board, the cathode of said first end varactor being connected via a terminal provided to said second printed circuit board to a cathod of an ajacent varactor, the cathode of said second end varactor being connected via another terminal provided to said second printed circuit board to a cathod of an ajacent varactor.

6. A voltage controlled oscillator having a non-switching continuous frequency band, comprising:
   (a) an oscillating circuit;
   (b) a series circuit of a coupling capacitor and a resonant circuit coil, connected to said oscillating circuit;
   (c) a parallel circuit of varactors, having one branch including a series connection of at least two varactors, which parallel circuit is connected via said series circuit of said coupling capacitor and said resonant circuit coil to said oscillating circuit so as to form a series resonant circuit; and
   (d) means for supplying a D.C. bias voltage to each of said varactors constituting said parallel circuit.

7. A voltage-controlled oscillator as claimed in claim 6, wherein the series connected varactors are connected in such a manner that a cathode of one varactor is connected to a cathode of a next varactor.

8. A voltage-controlled oscillator, as claimed in claim 7, further comprising a printed circuit board on which various parts constituting said voltage-controlled oscillator are provided, each of said varactors having an anode terminal and a cathode terminal respectively at both ends thereof, said printed circuit board having a ground terminal to which the anode of a first end varactor, which is positioned at one end of said series circuit, is connected, said first end varactor being attached to said printed circuit board so that said first end varactor is substantially normal to the plane of said printed circuit board and the cathode thereof is spaced from said ground terminal, a second end varactor, which is positioned at the other end of said series circuit, being attached to said printed circuit board so that said second end varactor is substantially normal to the plane of said printed circuit board and the cathode thereof is spaced from said printed circuit board, remaining varactors being interposed between the cathodes of said first and second end varactors in such a manner that they are substantially parallel to said printed circuit board, having a space from said printed circuit board, the D.C.

bias supplying means having a plurality of first circuits each connected to a junction between cathodes of any two consecutive varactors in such a manner that each of said first circuits is spaced from said printed circuit board, and a plurality of second circuits each connected to anode of each of said varactors other than those connected to said ground terminal.

9. A voltage-controlled oscillator, as claimed in claim 8, further comprising a second printed circuit board connected to the cathodes of said first and second end varactors, said second printed circuit board being substantially parallel to said first mentioned printed circuit board, the cathode of said first end varactor being connected via a terminal provided to said second printed circuit board to a cathod of an ajacent varactor, the cathode of said second end varactor being connected via another terminal provided to said second printed circuit board to a cathod of an ajacent varactor.

10. A voltage controlled oscillator having a non-switching continuous frequency band, comprising:
 (a) an oscillating circuit;
 (b) a series circuit of a coupling capacitor and a resonant circuit coil, connected to said oscillating circuit;
 (c) a matrix of a plurality of varactors, said matrix having a plurality of rows each having a series circuit of two or more varactors, said plurality of rows being connected in parallel, said matrix being connected via said series circuit of said coupling capacitors and said resonant coil to said oscillating circuit so as to form a series resonant circuit; and
 (d) means for supplying a D.C. bias voltage to each of said varactors constituting said matrix.

11. A voltage-controlled oscillator, as claimed in claim 10, further comprising a printed circuit board on which various parts constituting said voltage-controlled oscillator are provided, each of said varactors having an anode terminal and a cathode terminal respectively at both ends thereof, said printed circuit board having a ground terminal, the number of series varactors in each row being an even number, each of said varactors constituting said matrix being attached to said printed circuit board in such a manner that the anode thereof is attached to said printed circuit board, so that each varactor is substantially normal to the plane of said printed circuit board, the anodes of said first and end varactors each positioned at one end of each row being connected to said ground terminal, the cathodes of first end varactors being connected via a conductor to the cathodes of varactors of adjacent column, said conductor being substantially parallel to said printed circuit board and spaced from said printed circuit board, the anodes of said varactors of said adjacent column being connected via a terminal on said printed circuit board to anodes of varactors of next adjacent column, the anodes of second end varactors each positioned at the other end of each row being connected to each other by a conductor, and further connected to said series circuit of said coupling capacitor and said resonant coil.

* * * * *